(12) United States Patent
Ryu et al.

(10) Patent No.: US 8,981,514 B2
(45) Date of Patent: Mar. 17, 2015

(54) SEMICONDUCTOR PACKAGE HAVING A BLOCKING PATTERN BETWEEN A LIGHT TRANSMISSIVE COVER AND A SUBSTRATE, AND METHOD FOR FABRICATING THE SAME

(75) Inventors: Han-Sung Ryu, Yongin-si (KR); Byoung-Rim Seo, Hwaseong-si (KR); In-Won O, Jeonju-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 167 days.

(21) Appl. No.: 13/611,380

(22) Filed: Sep. 12, 2012

(65) Prior Publication Data

US 2013/0181314 A1    Jul. 18, 2013

(30) Foreign Application Priority Data

Jan. 17, 2012 (KR) ........................ 10-2012-0005314

(51) Int. Cl.
*H01L 27/146* (2006.01)

(52) U.S. Cl.
CPC .... *H01L 27/14618* (2013.01); *H01L 27/14623* (2013.01)
USPC ............ 257/435; 257/E31.127; 257/E21.499; 438/65

(58) Field of Classification Search
USPC .............. 257/435, E31.127, E21.499; 438/65
See application file for complete search history.

(56) References Cited

U.S. PATENT DOCUMENTS

| | | | | |
|---|---|---|---|---|
| 5,801,438 A | * | 9/1998 | Shirakawa et al. | 257/685 |
| 6,661,084 B1 | * | 12/2003 | Peterson et al. | 257/680 |
| 6,674,159 B1 | * | 1/2004 | Peterson et al. | 257/680 |
| 7,242,433 B2 | * | 7/2007 | Tanaka et al. | 348/340 |
| 7,282,788 B2 | * | 10/2007 | Chen | 257/680 |
| 7,615,835 B2 | * | 11/2009 | Takemasa | 257/417 |
| 7,692,259 B2 | * | 4/2010 | Suehiro | 257/431 |
| 7,808,097 B2 | * | 10/2010 | Wang et al. | 257/701 |
| 7,923,793 B2 | * | 4/2011 | Choi et al. | 257/415 |
| 8,269,298 B2 | * | 9/2012 | Nagamatsu et al. | 257/432 |
| 8,269,300 B2 | * | 9/2012 | Chien et al. | 257/434 |
| 8,354,743 B2 | * | 1/2013 | Jensen et al. | 257/686 |
| 8,432,011 B1 | * | 4/2013 | Oganesian | 257/432 |
| 8,450,847 B2 | * | 5/2013 | Ninz et al. | 257/737 |
| 8,604,576 B2 | * | 12/2013 | Oganesian | 257/432 |
| 2003/0128442 A1 | * | 7/2003 | Tanaka et al. | 359/819 |
| 2003/0223008 A1 | * | 12/2003 | Kim et al. | 348/340 |
| 2004/0244192 A1 | * | 12/2004 | Hsin et al. | 29/854 |
| 2005/0099531 A1 | * | 5/2005 | Wu et al. | 348/374 |
| 2005/0247990 A1 | * | 11/2005 | Cheng | 257/432 |
| 2005/0258502 A1 | * | 11/2005 | Kong et al. | 257/433 |
| 2006/0049475 A1 | * | 3/2006 | Wang et al. | 257/432 |
| 2007/0057356 A1 | * | 3/2007 | Chen | 257/680 |
| 2007/0096312 A1 | * | 5/2007 | Humpston et al. | 257/734 |

(Continued)

FOREIGN PATENT DOCUMENTS

JP    2005-323186 A    11/2005
JP    2010-252164 A    11/2010

(Continued)

*Primary Examiner* — Caleb Henry
(74) *Attorney, Agent, or Firm* — Lee & Morse, P.C.

(57) ABSTRACT

A semiconductor package includes a light transmissive cover having a conductive pattern, a substrate having a cavity, a semiconductor chip in the cavity of the substrate and electrically connected to the conductive pattern arranged on the light transmissive cover, and a blocking pattern between the light transmissive cover and the substrate.

19 Claims, 13 Drawing Sheets

(56) References Cited

U.S. PATENT DOCUMENTS

| | | | |
|---|---|---|---|
| 2007/0120213 A1* | 5/2007 | Hiew et al. | 257/433 |
| 2008/0087974 A1* | 4/2008 | Kwon et al. | 257/432 |
| 2008/0099864 A1* | 5/2008 | Wu et al. | 257/432 |
| 2008/0157250 A1* | 7/2008 | Yang et al. | 257/433 |
| 2008/0246868 A1* | 10/2008 | Abe | 348/308 |
| 2009/0008729 A1* | 1/2009 | Yang et al. | 257/432 |
| 2009/0045476 A1* | 2/2009 | Peng et al. | 257/432 |
| 2009/0267170 A1* | 10/2009 | Chien et al. | 257/434 |
| 2009/0283847 A1* | 11/2009 | Kawasaki et al. | 257/432 |
| 2010/0052086 A1* | 3/2010 | Kinsman | 257/432 |
| 2010/0117175 A1* | 5/2010 | Shizuno | 257/432 |
| 2010/0155869 A1* | 6/2010 | Komori et al. | 257/432 |
| 2010/0244166 A1* | 9/2010 | Shibuta et al. | 257/432 |
| 2010/0244171 A1* | 9/2010 | Nagamatsu et al. | 257/433 |
| 2010/0314703 A1* | 12/2010 | Chen | 257/432 |
| 2011/0068424 A1* | 3/2011 | Gambino et al. | 257/432 |
| 2011/0109791 A1* | 5/2011 | Obara et al. | 348/374 |
| 2011/0147871 A1* | 6/2011 | Utsumi et al. | 257/432 |
| 2011/0156188 A1* | 6/2011 | Tu et al. | 257/432 |
| 2011/0175182 A1* | 7/2011 | Chen et al. | 257/432 |
| 2011/0177632 A1* | 7/2011 | Meng et al. | 438/26 |
| 2011/0180822 A1* | 7/2011 | Ruhnau et al. | 257/88 |
| 2012/0043635 A1* | 2/2012 | Yang | 257/432 |
| 2012/0050590 A1* | 3/2012 | Suzuki et al. | 348/294 |
| 2012/0068288 A1* | 3/2012 | Hsin et al. | 257/432 |
| 2012/0104524 A1* | 5/2012 | Takeshita et al. | 257/432 |
| 2012/0211852 A1* | 8/2012 | Iwafuchi et al. | 257/435 |
| 2013/0026523 A1* | 1/2013 | Shiu et al. | 257/98 |
| 2013/0026589 A1* | 1/2013 | Wu et al. | 257/432 |
| 2013/0127000 A1* | 5/2013 | Oganesian | 257/432 |

FOREIGN PATENT DOCUMENTS

| | | |
|---|---|---|
| JP | 2010-263004 A | 11/2010 |
| KR | 10-2005-0118833 A | 12/2005 |

* cited by examiner

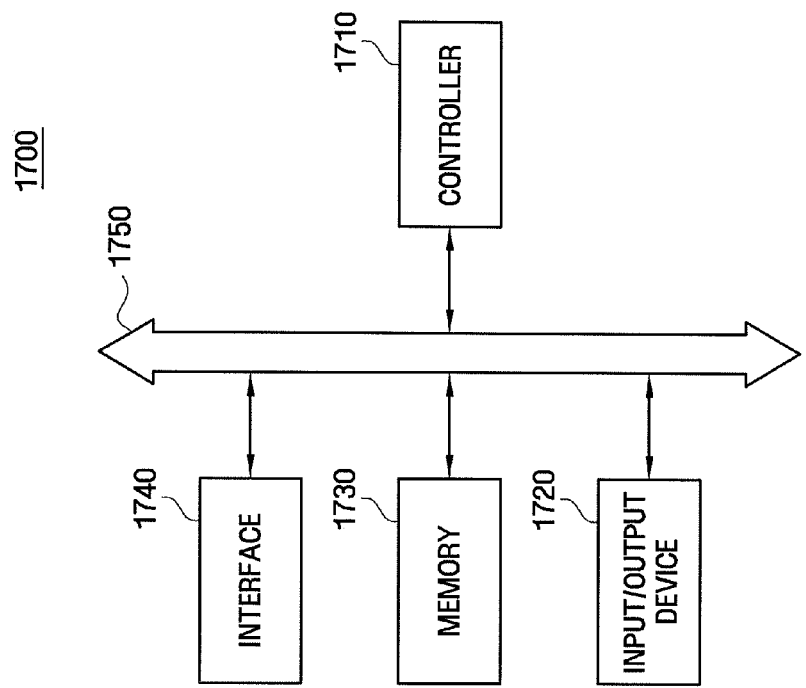

SEMICONDUCTOR PACKAGE HAVING A BLOCKING PATTERN BETWEEN A LIGHT TRANSMISSIVE COVER AND A SUBSTRATE, AND METHOD FOR FABRICATING THE SAME

CROSS-REFERENCE TO RELATED APPLICATIONS

This application claims priority under 35 U.S.C. §119 from Korean Patent Application No. 10-2012-0005314, filed on Jan. 17, 2012, in the Korean Intellectual Property Office, and entitled "Semiconductor Package and Method for Fabricating the Same," is incorporated by reference herein in its entirety.

BACKGROUND

1. Field

The present inventive concept relates to a semiconductor package and method for fabricating the same.

2. Description of the Related Art

An image sensor is one of semiconductor devices converting optical information into an electric signal. The image sensor may include a charge coupled device (CCD) image sensor and a complementary metal-oxide semiconductor (CMOS) image sensor.

The image sensor may be configured in the form of a package. In this case, the package may be configured to have a structure in which light can be incident on a photo-receiving surface or sensing area of the image sensor while protecting the image sensor.

SUMMARY

Example embodiments provide a semiconductor package including a light transmissive cover having a conductive pattern, a substrate having a cavity, a semiconductor chip in the cavity of the substrate and electrically connected to the conductive pattern on the light transmissive cover, and a blocking pattern between the light transmissive cover and the substrate.

The semiconductor package may include an underfill material between the light transmissive cover and the substrate, the blocking pattern separating the underfill material from the semiconductor chip. The underfill material may include at least one of epoxy resin and silicone resin.

The blocking pattern may be in contact with the substrate and separated from the light transmissive cover or may be in contact with the conductive pattern of the light transmissive cover and separated from the substrate.

The blocking pattern may include a first blocking pattern in contact with the substrate and a second blocking pattern in contact with the light transmissive cover. The first blocking pattern and the second blocking pattern may include different materials. The first blocking pattern and the second blocking pattern are separated from each other.

The conductive pattern on the light transmissive cover may be electrically connected to the semiconductor chip using bump balls.

The semiconductor chip may include an image sensor chip.

The semiconductor package may include a through hole extending from the cavity, the semiconductor chip covering the through hole, and a heat dissipation plate in the through hole of the substrate and disposed below the semiconductor chip.

A lower surface of the heat dissipation plate and a lower surface of the substrate may be on a same plane.

The semiconductor package may include another semiconductor chip electrically connected to the first semiconductor chip and in contact with a lower surface of the heat dissipation plate. The semiconductor chip may include an image sensor chip and the another semiconductor chip may include an operation chip.

The through hole may have a first diameter and the cavity may have a second diameter larger than the first diameter.

Example embodiments provide a semiconductor package including a light transmissive cover having a conductive pattern, a substrate having a cavity, a semiconductor chip in the cavity of the substrate and electrically connected to the conductive pattern on the light transmissive cover, and a blocking pattern between the light transmissive cover and the substrate, the blocking pattern configured to prevent material provided between the light transmissive cover and the substrate from reaching the semiconductor chip.

The blocking pattern may be in contact with the substrate and may be separated from the light transmissive cover.

The blocking pattern may be in contact with the conductive pattern and may be separated from the substrate.

BRIEF DESCRIPTION OF THE DRAWINGS

Features will become apparent to those of ordinary skill in the art by describing in detail exemplary embodiments with reference to the attached drawings in which:

FIGS. 12 and 13 illustrate application examples of semiconductor packages in accordance with some embodiments.

DETAILED DESCRIPTION

Figure 1:
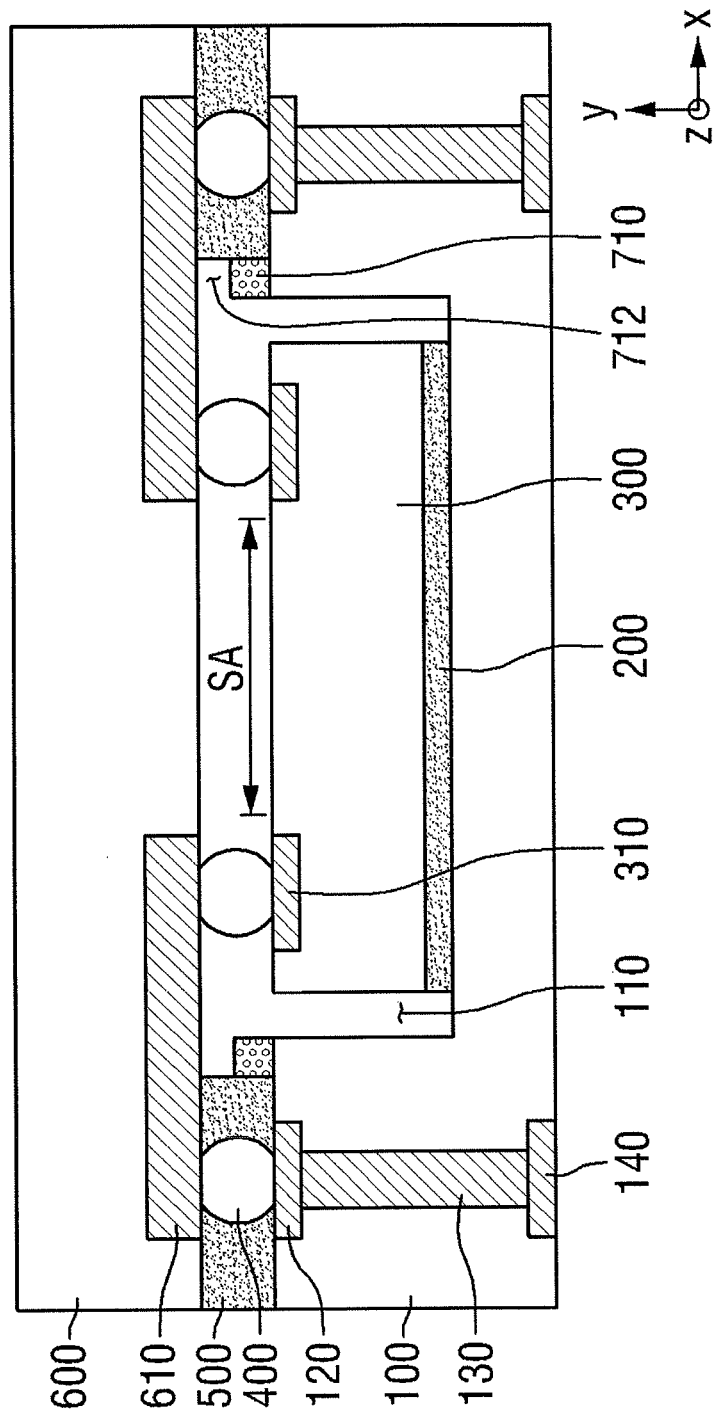
FIG. 1 illustrates a cross-sectional view showing a semiconductor package in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the exemplary embodiments to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

It will be understood that when an element or layer is referred to as being "connected to" another element or layer, it can be directly connected to the other element or layer or intervening elements or layers may be present. In contrast, when an element is referred to as being "directly connected to" another element or layer, there are no intervening elements present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented and the spatially relative descriptors used herein interpreted accordingly.

The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings herein.

Unless defined otherwise, all technical and scientific terms used herein have the same meaning as commonly understood by one of ordinary skill in the art to which this disclosure belongs. It is noted that the use of any and all examples, or exemplary terms provided herein is intended merely to better illuminate embodiments and is not a limitation unless otherwise specified. Further, unless defined otherwise, all terms defined in generally used dictionaries may not be overly interpreted.

A semiconductor package in accordance with an embodiment will be described with reference to FIG. 1. FIG. 1 illustrates a cross-sectional view showing a semiconductor package in accordance with an embodiment. Referring to FIG. 1, the semiconductor package includes a substrate 100, a semiconductor chip 300, a light transmissive cover 600, and a blocking pattern 710.

As shown in the drawings, a cavity 110 may be formed in the substrate 100. The cavity 110 illustrated may be formed by patterning an upper partial region of the substrate 100.

The substrate 100 may be formed of an insulating material. The insulating material of the substrate 100 may be, e.g., liquid crystal polymer (LCP), polycarbonate, polyphenylsulfide, or the like, but embodiments are not limited thereto.

As shown in the FIG. 1, first substrate pads 120 may be arranged on an upper surface of the substrate 100 and second substrate pads 140 may be arranged on a lower surface of the substrate 100. Through vias 130 may be formed in the substrate 100 to electrically connect the first substrate pads 120 to the second substrate pads 140.

The first substrate pads 120 may be electrically connected to the semiconductor chip 300 via a conductive pattern 610 on the light transmissive cover 600. The second substrate pads 140 may be electrically connected to a main substrate (not shown), another semiconductor package (not shown), or the like disposed outside the substrate 100 (e.g., below the substrate 100). For example, if a main substrate (not shown) is disposed below the substrate 100, the main substrate (not shown) may be, e.g., a printed wire board (PWB), flexible PWB, or rigid flexible PWB, and a structure, e.g., solder balls (not shown), may be disposed between the second substrate pads 140 and the main substrate (not shown) to electrically connect them with each other.

The semiconductor chip 300 may be disposed in the cavity 110 formed in the substrate 100. The semiconductor chip 300 may be fixed to the inside of the cavity 110 of the substrate 100 through an adhesive layer 200. Although only a case where the semiconductor chip 300 is fixed to the inside of the cavity 110 of the substrate 100 through the adhesive layer 200 has been illustrated in FIG. 1, embodiments are not limited thereto, and other methods of fixing the semiconductor chip 300 to the inside of the cavity 110 of the substrate 100 may be used.

In this embodiment, the semiconductor chip 300 may be, e.g., an image sensor chip which converts light incident from the outside into an electrical signal or the like. If the semiconductor chip 300 is such an image sensor chip, the semiconductor chip 300 may include a sensing area SA for sensing the light incident from the outside. The image sensor chip may be, e.g., a charge coupled device (CCD) image sensor chip, a complementary metal-oxide semiconductor (CMOS) image sensor chip, and so forth.

Chip pads 310 may be disposed on an upper surface of the semiconductor chip 300 to electrically connect the semiconductor chip 300 to elements disposed outside the semiconductor chip 300 (e.g., above the semiconductor chip 300). If the semiconductor chip 300 is the image sensor chip, the chip pads 310 may be disposed outside the sensing area SA of an image sensor.

The light transmissive cover 600 may be disposed on the substrate 100 and the semiconductor chip 300. The light transmissive cover 600 may be formed of a material capable of transmitting the light incident from the outside. In some embodiments, the light transmissive cover 600 may be a material having excellent light transmissivity, e.g., a glass substrate such as at least one of soda-lime glass and borosilicate glass.

The conductive pattern 610 may be on the light transmissive cover 600 or inside the light transmissive cover 600, as shown in FIG. 1. The conductive pattern 610 disposed inside the light transmissive cover 600 may be formed by patterning one surface of the light transmissive cover 600 to form a cavity and filling the cavity with a conductive material.

If the semiconductor chip 300 is the image sensor chip, the conductive pattern 610 on the light transmissive cover 600 may be disposed not to overlap the sensing area SA of the image sensor to prevent the conductive pattern 610 from blocking the light incident on the image sensor.

A structure may be disposed between the light transmissive cover 600 and the substrate 100 and between the light transmissive cover 600 and the semiconductor chip 300 to electrically connect them with each other. In this embodiment, this structure may be, e.g., bump balls 400 as shown in FIG. 1.

Specifically, the bump balls 400 may be disposed between the chip pads 310 arranged on the upper surface of the semiconductor chip 300 and the conductive pattern 610 arranged on the light transmissive cover 600 to electrically connect the semiconductor chip 300 with the conductive pattern 610 of the light transmissive cover 600. Further, the bump balls 400 may be disposed between the first substrate pads 120 arranged on the upper surface of the substrate 100 and the conductive pattern 610 arranged on the light transmissive cover 600 to electrically connect the second substrate pads 140 arranged on the lower surface of the substrate 100 with the conductive pattern 610 of the light transmissive cover 600.

In this case, the bump balls 400 may be formed to have a sufficient thickness such that the bump balls 400 can be in contact with all of the chip pads 310, the conductive pattern 610, and the first substrate pads 120. The bump balls 400 may include, e.g., at least one of gold, silver, nickel, copper and tin alloy. Further, the bump balls 400 may be formed by combining two or more materials. For example, the bump balls 400 may include at least one of copper-nickel-lead (Cu—Ni—Pb), copper-nickel-gold (Cu—Ni—Au), copper-nickel (Cu—Ni), nickel-gold (Ni—Au) and nickel-silver (Ni—Ag).

Although a case where the light transmissive cover 600, the substrate 100, and the semiconductor chip 300 are electrically connected to each other by using the bump balls 400 has been illustrated in FIG. 1, embodiments are not limited thereto. In other words, although the light transmissive cover 600, the substrate 100 and the semiconductor chip 300 are electrically connected to each other in a flip chip bonding manner in FIG. 1, embodiments are not limited thereto. For example, a method of providing the needed electrical connections may include using an anisotropic conductive film (ACF) or the like.

An underfill material 500 may be disposed between the light transmissive cover 600 and the substrate 100 outside the blocking pattern 710. The underfill material 500 may serve to prevent foreign substances and the like introduced from the outside from entering the inside (e.g., the semiconductor chip 300) of the semiconductor package. In order to implement this function, the underfill material 500 may be disposed in contact with the light transmissive cover 600 and the substrate 100 without being separated from the light transmissive cover 600 and the substrate 100. In this embodiment, the underfill material 500 may include, e.g., at least one of epoxy resin and silicone resin, but embodiments are not limited thereto. Rather, any material composition that can provide the above-described functions may be used as the underfill material 500.

The blocking pattern 710 may be disposed between the light transmissive cover 600 and the substrate 100. The blocking pattern 710 may be disposed on the inside of the underfill material 500. In other words, the underfill material 500 may be disposed between the light transmissive cover 600 and the substrate 100 on the outside of the blocking pattern 710, e.g., the blocking pattern 710 is between the underfill material 500 and the semiconductor chip 300, i.e., the blocking pattern 710 prevents the underfill material 500 from reaching the semiconductor chip 300.

The blocking pattern 710 may serve as a bank, i.e., to prevent the underfill material 500 disposed on the outside of the blocking pattern 710 from entering the semiconductor chip 300 in a process of fabricating the semiconductor package. Accordingly, the blocking pattern 710 may be formed to have a sufficient height to prevent the injected underfill material 500 from being introduced into the semiconductor chip 300 in the process of fabricating the semiconductor package. Thus, the underfill material 500 prevents the foreign substances and the like introduced from the outside from entering the inside of the semiconductor package, and the blocking pattern 710 prevents the underfill material 500 from being introduced into the semiconductor chip 300. Accordingly, the semiconductor package in accordance with this embodiment can be sealed reliably, thereby improving the reliability of the quality of the fabricated semiconductor package.

In FIG. 1, the blocking pattern 710 may be formed in contact with the substrate 100 while being separated from the light transmissive cover 600. If the viscosity of the underfill material 500 is sufficiently large, the underfill material 500 is not introduced to the semiconductor chip 300 through a separation space 712 between the blocking pattern 710 and the light transmissive cover 600 as shown in FIG. 1. However, if necessary, the height of the blocking pattern 710 may be changed to block the introduction of the underfill material 500. That is, in some embodiments, the blocking pattern 710 may be formed in contact with both the substrate 100 and the light transmissive cover 600, i.e., there may be no separation space 712.

In this embodiment, the blocking pattern 710 may be formed of an insulating material. The insulating material may be, e.g., benzocyclobutene (BCB), polyimide, epoxy or the like, but embodiments are not limited thereto. In some embodiments, one sidewall of the blocking pattern 710 and one sidewall of the cavity 110 may be formed on the same plane as shown in FIG. 1.

Figure 2:
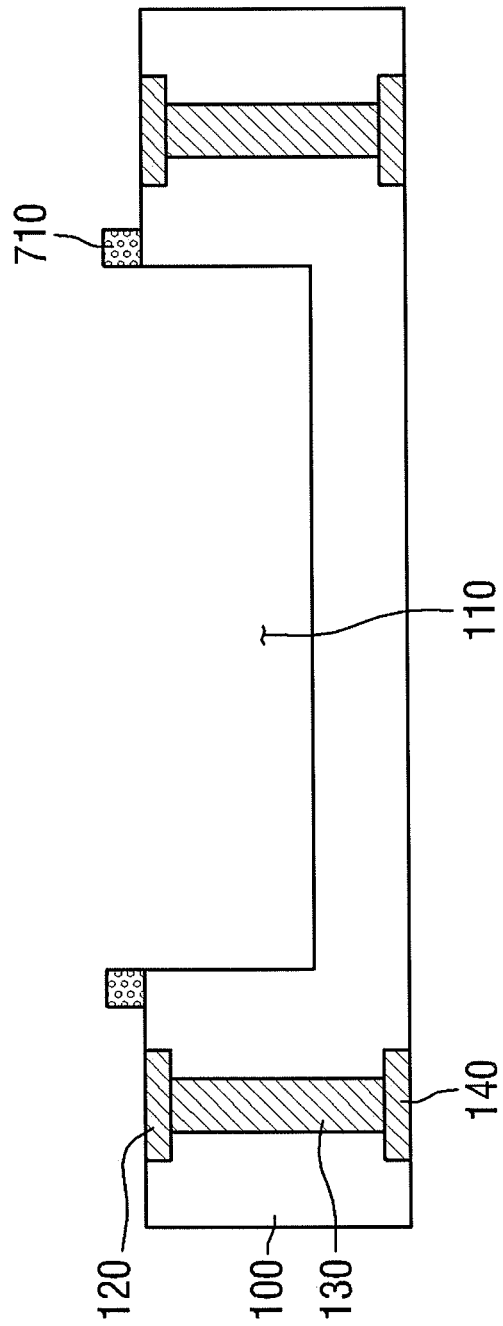
FIGS. 2 to 4 illustrate diagrams showing intermediate steps for explaining a method for fabricating the semiconductor package in accordance with an embodiment.
Figure 3:
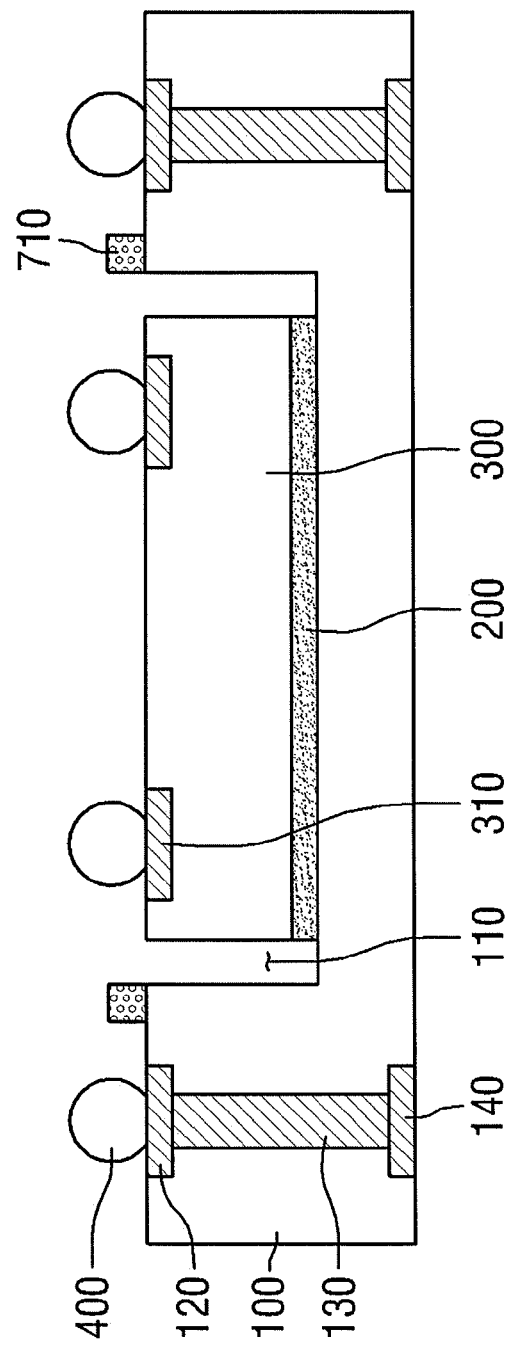
Figure 4:
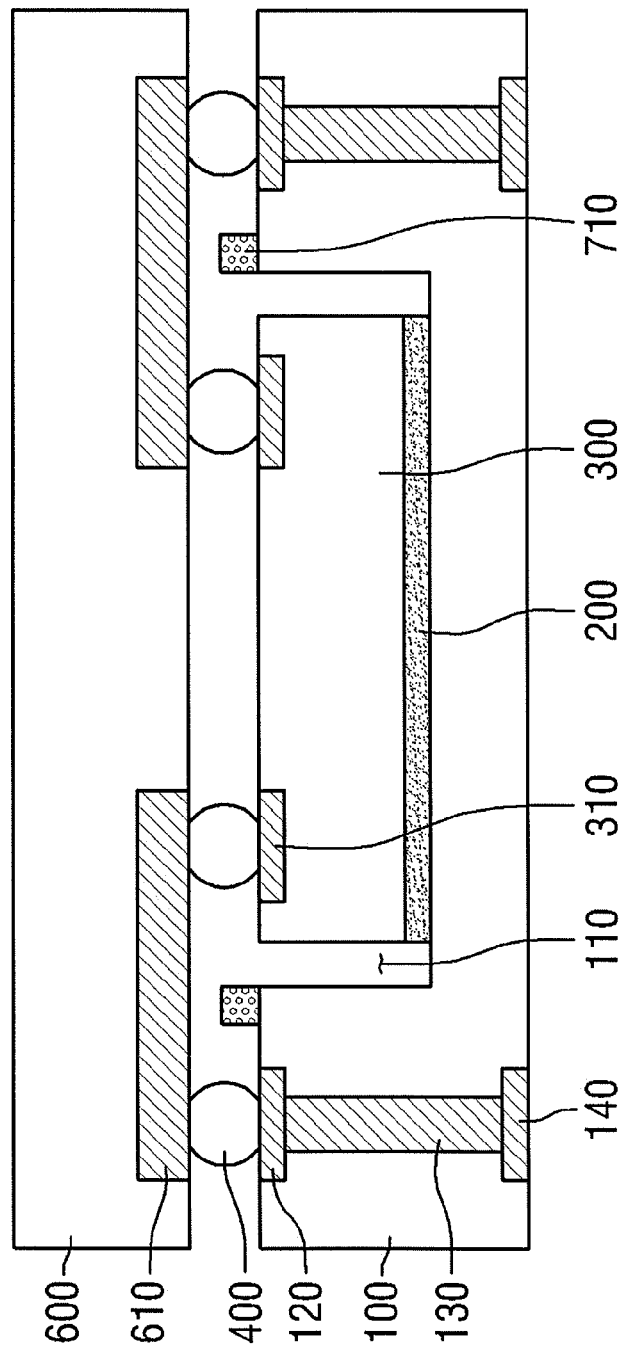

Next, a method for fabricating the semiconductor package in accordance with the embodiment shown in FIG. 1 will be described with reference to FIGS. 2 to 4. FIGS. 2 to 4 are diagrams showing intermediate stages in a method for fabricating the semiconductor package in accordance with the embodiment shown in FIG. 1.

First, referring to FIG. 2, the substrate 100 having the cavity 110 is prepared. Here, a method for forming the cavity 110 in the substrate 100 may include, e.g., forming a specific mask pattern (not shown) on the upper surface of the substrate 100, and etching the substrate 100 using the mask pattern (not shown), thereby forming the cavity 110 in the substrate 100. In this case, the cavity 110 formed in the substrate 100 may not pass through the substrate 100 as shown in FIG. 2. That is, a lower surface of the cavity 110 may be defined by the substrate 100.

Subsequently, the first substrate pads 120, the second substrate pads 140, and the through vias 130 may be formed in the substrate 100. The through vias 130 may be formed in contact with the first substrate pads 120 and the second substrate pads 140 such that the first substrate pads 120 disposed on the upper surface of the substrate 100 can be electrically connected to the second substrate pads 140 disposed on the lower surface of the substrate 100. In this embodiment, all of the first substrate pads 120, the second substrate pads 140, and the through vias 130 may be formed in the substrate 100 as shown in the drawings.

Meanwhile, although a case where the cavity 110 is formed first in the substrate 100 and then a conductive pattern including the first substrate pads 120, the second substrate pads 140, and the through vias 130 is formed in the substrate 100 has been described, embodiments are not limited thereto. That is, the above-described formation sequence may be changed as appropriate.

Subsequently, the blocking pattern 710 is disposed on the substrate 100. The blocking pattern 710 may be disposed on the upper surface of the substrate 100 on the outside of the cavity 110 formed in the substrate 100 as shown in FIG. 2. Further, the blocking pattern 710 may be disposed not to overlap the first substrate pads 120 formed on the upper surface of the substrate 100.

The blocking pattern 710 may be disposed to have substantially the same height as that of the bump balls 400 (see FIG. 3) to be disposed on the first substrate pads 120. However, if necessary, the height of the blocking pattern 710 may be adjusted to be lower or higher than the height of the bump balls 400 along the y-axis.

If the height of the blocking pattern 710 is lower than that of the bump balls 400 (see FIG. 3), the separation space 712 (see FIG. 1) may occur between the blocking pattern 710 and the light transmissive cover 600 to be disposed on the substrate 100. However, as described above, when the underfill material 500 (see FIG. 1) to be injected has a sufficiently large viscosity, the underfill material 500 (see FIG. 1) is not introduced to the semiconductor chip 300 through the separation space 712.

Meanwhile, if the height of the blocking pattern 710 is higher than that of the bump balls 400 along the y-axis (see FIG. 3), the blocking pattern 710 may be in contact with the light transmissive cover 600 to be disposed on the substrate 100. However, generally, since the light transmissive cover 600 is disposed on the substrate 100 before the blocking pattern 710 is completely hardened, the conductive pattern 610 arranged on the light transmissive cover 600 may readily be in contact with the bump balls 400 (see FIG. 3).

In this embodiment, the blocking pattern 710 may be formed of an insulating material. The insulating material may be, e.g., benzocyclobutene (BCB), polyimide, epoxy or the like, but embodiments are not limited thereto.

Then, referring to FIG. 3, the semiconductor chip 300 is disposed in the cavity 110 of the substrate 100. The semiconductor chip 300 may be fixed to the inside of the cavity 110 of the substrate 100 through the adhesive layer 200.

Subsequently, the bump balls 400 are formed on the chip pads 310 disposed on the upper surface of the semiconductor chip 300 and the first substrate pads 120. The bump balls 400 may include, e.g., at least one of gold, silver, nickel, copper and tin alloy. Further, the bump balls 400 may be formed by combining two or more materials. For example, the bump balls 400 may be include at least one of copper-nickel-lead (Cu—Ni—Pb), copper-nickel-gold (Cu—Ni—Au), copper-nickel (Cu—Ni), nickel-gold (Ni—Au) and nickel-silver (Ni—Ag).

Then, referring to FIG. 4, the light transmissive cover 600 having the conductive pattern 610 is prepared and is disposed on the semiconductor chip 300 such that the conductive pattern 610 of the light transmissive cover 600 and the semiconductor chip 300 can be electrically connected to each other. In this case, the conductive pattern 610 of the light transmissive cover 600, the semiconductor chip 300, and the first substrate pads 120 can be electrically connected to each other through the bump balls 400 as shown in FIG. 4. In other words, the conductive pattern 610 of the light transmissive cover 600, the semiconductor chip 300, and the substrate 100 may be electrically connected to each other by flip chip bonding.

Then, referring to FIG. 1, the underfill material 500 is injected between the substrate 100 and the light transmissive cover 600 on the outside of the blocking pattern 710. In this case, the underfill material 500 may be injected to be in contact with the light transmissive cover 600 and the substrate 100 without being separated from the light transmissive cover 600 and the substrate 100 by using, e.g., a dispensing process or the like.

Figure 5:
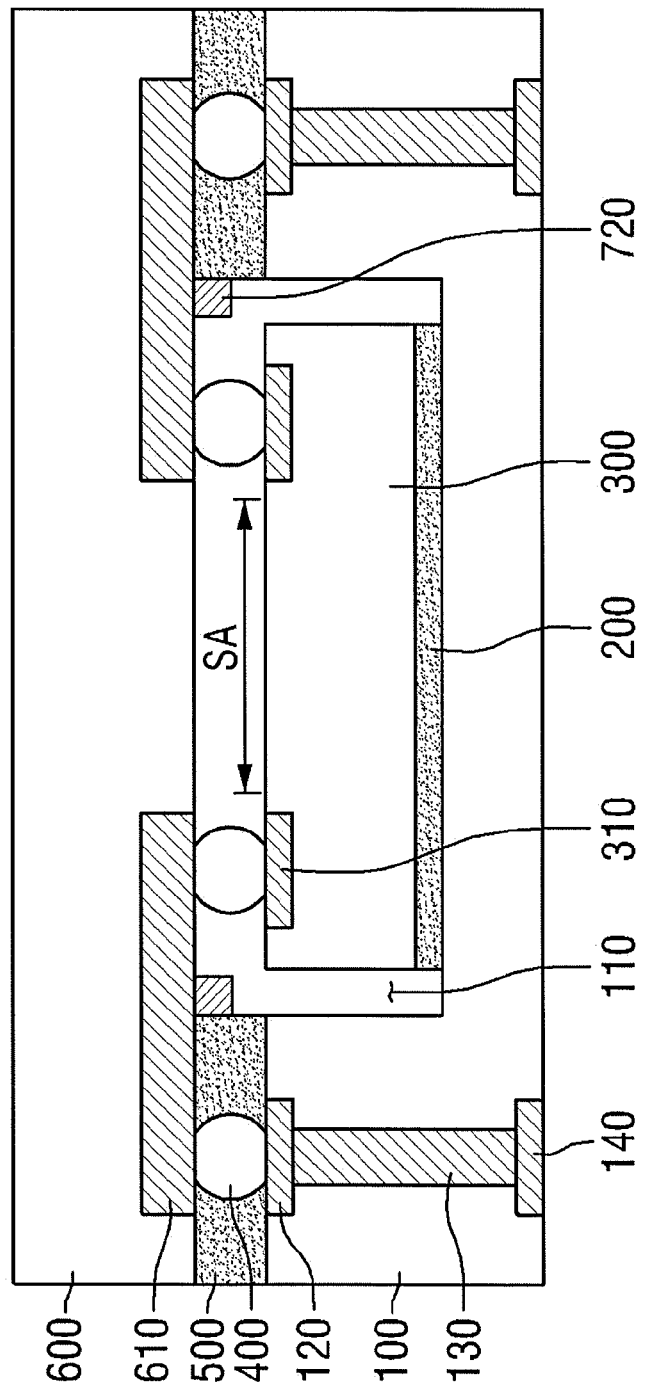
FIG. 5 illustrates a cross-sectional view of a semiconductor package in accordance with an embodiment.

Next, a semiconductor package in accordance with another embodiment will be described with reference to FIG. 5. FIG. 5 is a cross-sectional view of a semiconductor package in accordance with another embodiment. A description of substantially the same components as those of the above-described embodiment will not be repeated and an explanation will be given focusing on differences.

Referring to FIG. 5, in this embodiment, a blocking pattern 720 may be formed to be in contact with the light transmissive cover 600 and separated from the substrate 100. Specifically, the blocking pattern 720 may be formed in contact with the conductive pattern 610 of the light transmissive cover 600 while being separated from the substrate 100. The underfill material 500 may be disposed between the substrate 100 and the light transmissive cover 600 on the outside of the blocking pattern 720.

The blocking pattern 720 may be made of a material that can be easily formed on the conductive pattern 610. In this embodiment, the blocking pattern 720 may be formed of, e.g., a conductive material.

Although a case where the blocking pattern 720 is disposed to overlap the cavity 110 of the substrate 100 has been illustrated in FIG. 5, embodiments are not limited thereto. In some embodiments, the blocking pattern 720 may be disposed at a region outside the cavity 110 so as not to overlap the cavity 110 of the substrate 100. Further, although a case where the height of the blocking pattern 720 is lower than that of the bump balls 400 has been illustrated in FIG. 5, embodiments are not limited thereto. In some embodiments, the blocking pattern 720 and the bump balls 400 may be formed to have substantially the same height or the blocking pattern 720 may be taller than the bump balls 400.

Next, stages in a method of fabricating the semiconductor package in accordance with another embodiment shown in FIG. 5 will be described with reference to FIGS. 6 to 8.

Figure 6:
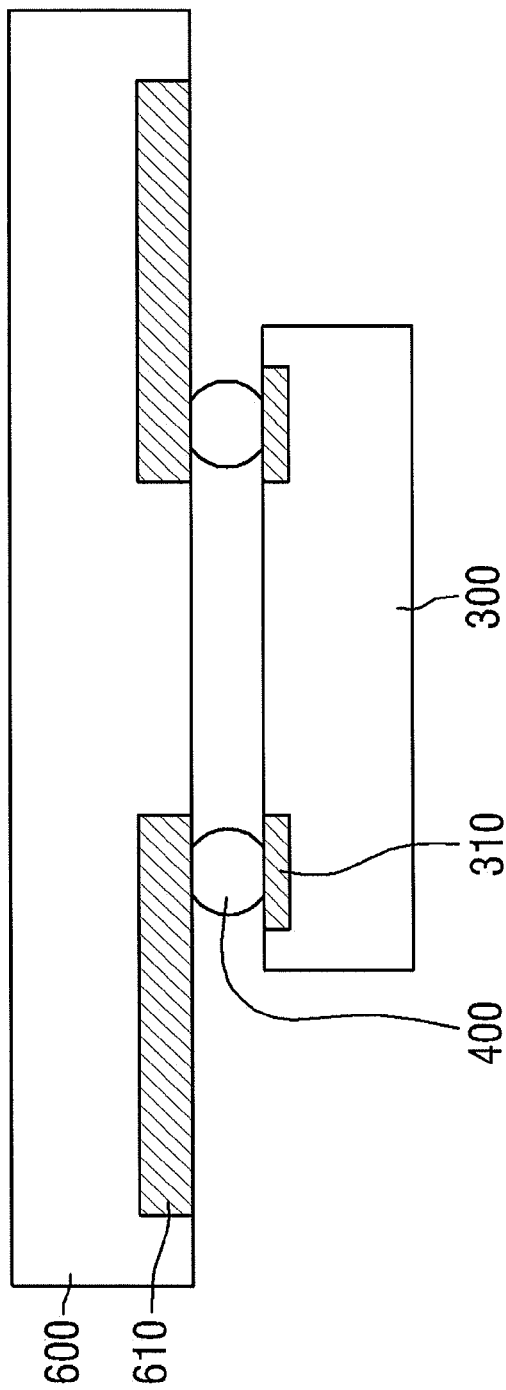
FIGS. 6 to 8 illustrate diagrams showing intermediate stages in a method for fabricating the semiconductor package in accordance with an embodiment.
Figure 7:
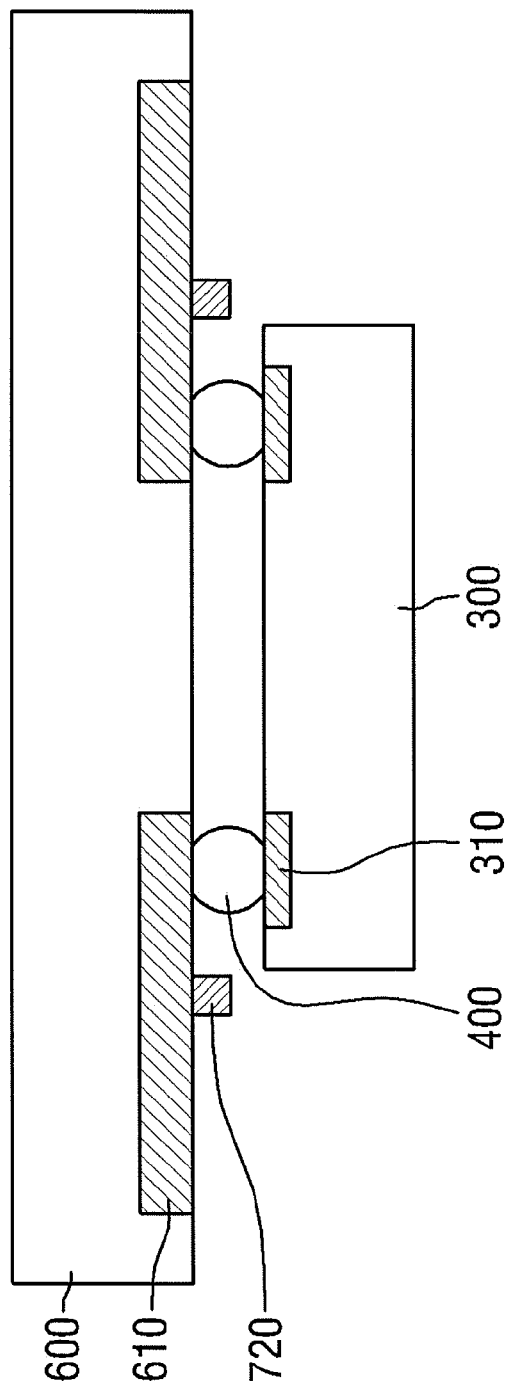

First, referring to FIG. 6, the light transmissive cover 600 having the conductive pattern 610 is prepared. Then, the semiconductor chip 300 is disposed below the light transmissive cover 600 to be electrically connected to the conductive pattern 610 of the light transmissive cover 600. In this case, the conductive pattern 610 of the light transmissive cover 600 and the semiconductor chip 300 can be electrically connected to each other through the bump balls 400.

Specifically, the bump balls 400 may be disposed in contact with the chip pads 310 and the conductive pattern 610 between the chip pads 310 of the semiconductor chip 300 and the conductive pattern 610 of the light transmissive cover 600. That is, the light transmissive cover 600 and the semiconductor chip 300 may be connected to each other by flip chip bonding.

Then, referring to FIG. 7, the blocking pattern 720 is disposed below the light transmissive cover 600. Specifically, below the conductive pattern 610 of the light transmissive cover 600, the blocking pattern 720 may be formed in contact with the conductive pattern 610. The blocking pattern 720 may be disposed below the light transmissive cover 600 on the outside of the semiconductor chip 300 as shown in FIG. 7.

The blocking pattern 720 may be made of a material (e.g., conductive material) that can be easily formed on the conductive pattern 610, but embodiments are not limited thereto. Although the blocking pattern 720 and the bump balls 400 can be formed to have substantially the same height, as described above, embodiments are not limited thereto.

Figure 8:
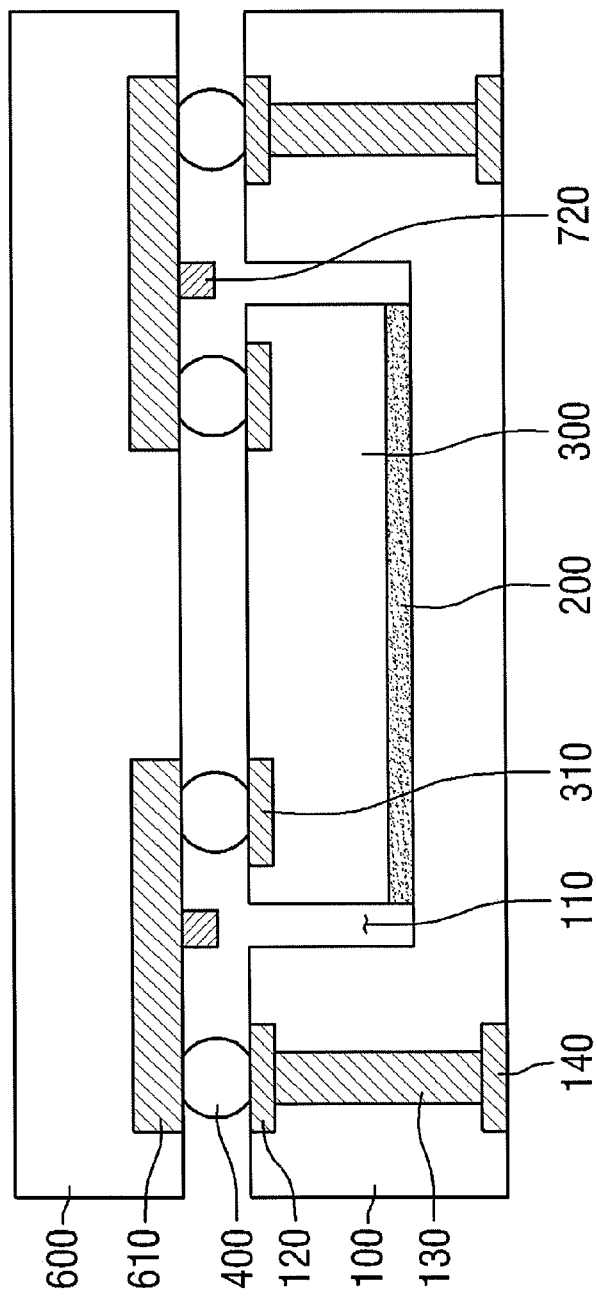

Then, referring to FIG. 8, the substrate 100 having the cavity 110 is prepared, and the light transmissive cover 600 is disposed on the substrate 100 such that the semiconductor chip 300 is disposed in the cavity 110 of the substrate 100, and the substrate 100 is electrically connected to the conductive pattern 610 of the light transmissive cover 600. In this case, the conductive pattern 610 of the light transmissive cover 600 can be electrically connected to the first substrate pads 120 of the substrate 100 through the bump balls 400. That is, the light transmissive cover 600 and the substrate 100 can be electrically connected to each other by flip chip bonding.

Then, referring to FIG. 5, the underfill material 500 is injected between the substrate 100 and the light transmissive cover 600 on the outside of the blocking pattern 720. In this case, the underfill material 500 may be injected to be in contact with the light transmissive cover 600 and the substrate 100 without separating the light transmissive cover 600 and the substrate 100 by using, e.g., a dispensing process or the like.

Figure 9:
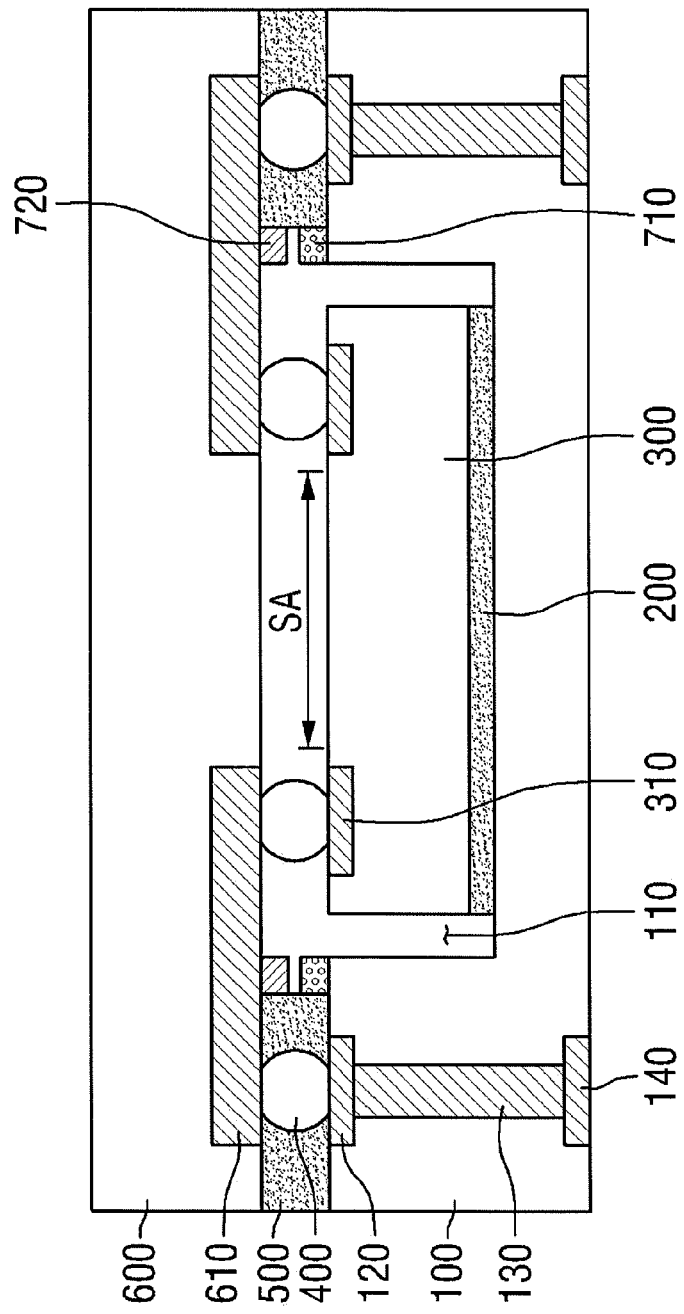
FIG. 9 illustrates a cross-sectional view of a semiconductor package in accordance with an embodiment.

Next, a semiconductor package in accordance with still another embodiment will be described with reference to FIG. 9. FIG. 9 illustrates a cross-sectional view of a semiconductor package in accordance with still another embodiment. Similarly, a description of substantially the same components as those of the above-described embodiments will not be repeated and an explanation will be given focusing on differences.

Referring to FIG. 9, in this embodiment, the banking may include both types of blocking patterns. In particular, the block pattern 710 may serve as a first blocking pattern 710 in contact with the substrate 100 and separated from the light transmissive cover 600 and the blocking pattern 720 may serve as a second blocking pattern 720 in contact with the light transmissive cover 600 and separated from the substrate 100. The first blocking pattern 710 and the second blocking pattern 720 may be formed to be separated from each other as shown in FIG. 9, but may be formed in contact with each other if necessary. That is, the shapes and configurations of the blocking patterns 710 and 720 are not limited to the illustrated shapes and configurations. For example, the first and second blocking patterns 710, 720 may be offset from one another along the x-direction. For example, the first and second blocking patterns 710, 720 may be offset from one another along the x-direction such that they do not overlap, e.g., such that the second blocking pattern 720 is positioned as shown in FIG. 5 and the first blocking pattern is positioned as shown in FIG. 1.

The first blocking pattern 710 and the second blocking pattern 720 may be formed of different materials. The first blocking pattern 710 may be formed of, e.g., an insulating material, and the second blocking pattern 720 may be formed of, e.g., a conductive material.

In some embodiments, the first blocking pattern 710 and the second blocking pattern 720 may be formed on the outside of the cavity 110 of the substrate 100 as shown in FIG. 9. However, without being limited thereto, any one of the first blocking pattern 710 and the second blocking pattern 720 may be formed on the outside of the cavity 110, and the other one may be formed to overlap the cavity 110. That is, the locations of the blocking patterns 710 and 720 are not limited to the illustrated locations.

Figure 10:
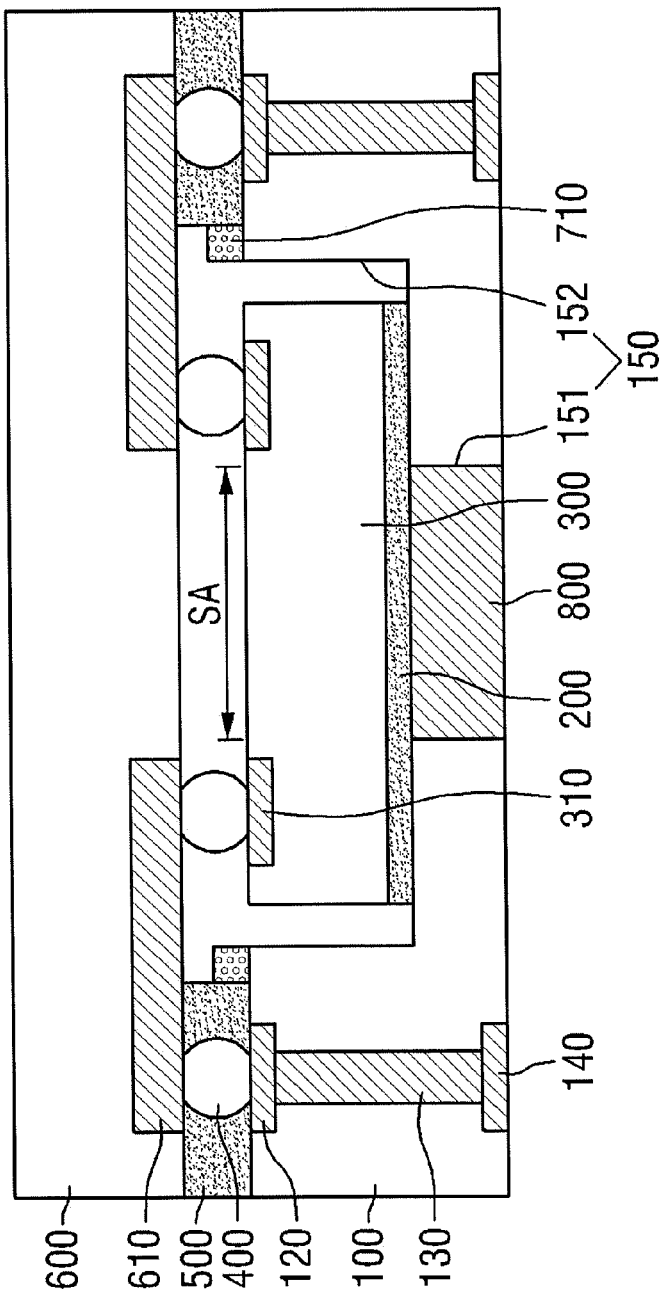
FIG. 10 illustrates a cross-sectional view of a semiconductor package in accordance with an embodiment.

Next, a semiconductor package in accordance with still another embodiment of will be described with reference to FIG. 10. FIG. 10 is a cross-sectional view of a semiconductor package in accordance with still another embodiment. Similarly, a description of substantially the same components as those of the above-described embodiments will not be repeated and an explanation will be given focusing on differences.

Referring to FIG. 10, the substrate 100 of this embodiment may include a mount 150 in the substrate 100 including a through hole 151 extending from a cavity 152. The through hole 151 may have a first diameter, and the cavity 152 may have a second diameter larger than the first diameter. In other words, the cross-sectional area of the cavity 152 may be larger than the cross-sectional area of the through hole 151.

The semiconductor chip 300 may be disposed in the cavity 152 and may cover the through hole 151 as shown in FIG. 10. Further, a heat dissipation plate 800 may be disposed in the through hole 151 to dissipate the heat generated from the semiconductor chip 300 to the outside. The heat dissipation plate 800 may be disposed adjacent to the semiconductor chip 300 below the semiconductor chip 300, as illustrated in FIG. 10, in order to effectively dissipate the heat generated from the semiconductor chip 300 to the outside. If necessary, the adhesive layer 200 interposed between the semiconductor chip 300 and the heat dissipation plate 800 may be omitted.

The heat dissipation plate 800 may be formed of a material having high thermal conductivity. A lower surface of the heat dissipation plate 800 and the lower surface of the substrate 100 may be disposed on the same plane. Accordingly, the lower surface of the heat dissipation plate 800 is exposed to the outside to discharge the heat provided from the semiconductor chip 300 and the like to the outside.

The heat dissipation plate 800 may be formed by, for example, forming the semiconductor package (see FIG. 1) in accordance with the embodiment, patterning the lower surface of the substrate 100, and forming a conductive material in the patterned space.

Meanwhile, although a case where the width of the heat dissipation plate 800 is smaller than the width of the semiconductor chip 300 has been illustrated in FIG. 10, embodiments are not limited thereto. If necessary, the heat dissipation plate 800 may be formed to have a width larger than that of the semiconductor chip 300. Meanwhile, although the blocking pattern 710 is formed on the substrate 100 in FIG. 10, embodiments are not limited thereto. The arrangement and shape of the blocking pattern may be modified according to the any of the above-described embodiments.

Figure 11:
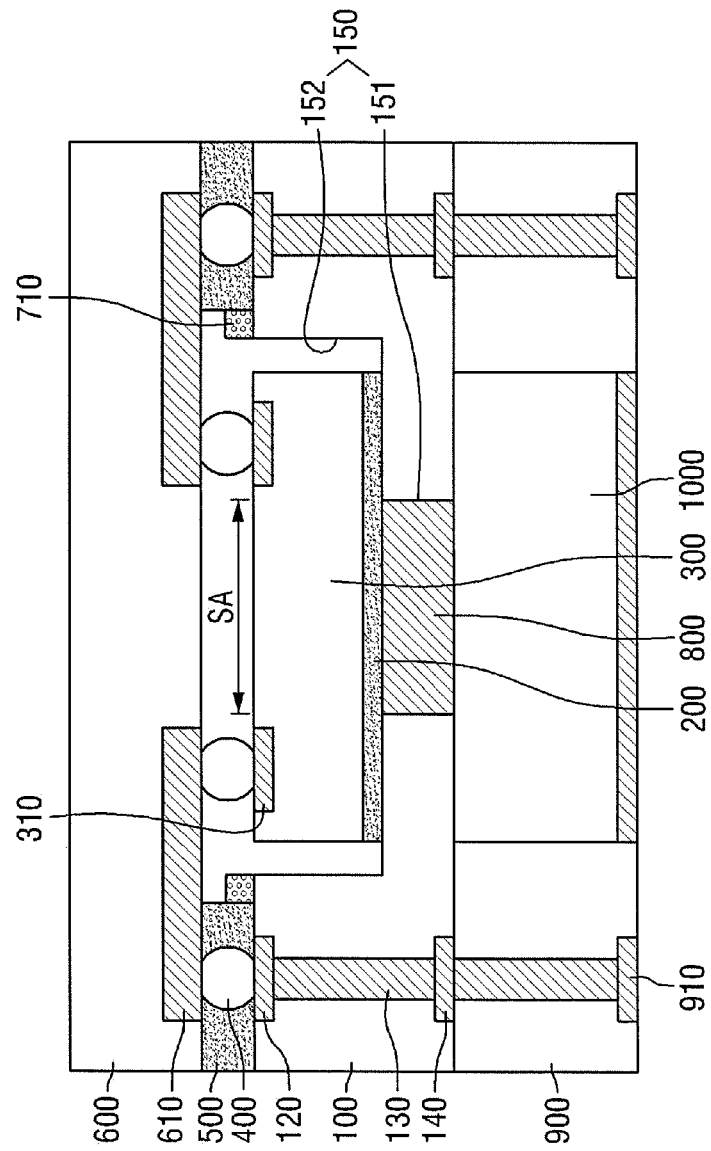
FIG. 11 illustrates a cross-sectional view of a semiconductor package in accordance with an embodiment.

Next, a semiconductor package in accordance with still another embodiment will be described with reference to FIG. 11. FIG. 11 is a cross-sectional view of a semiconductor package in accordance with still another embodiment. Similarly, a description of substantially the same components as those of the above-described embodiments will be omitted and an explanation will be given focusing on differences.

Referring to FIG. 11, the semiconductor package in accordance with this embodiment may further include a second substrate 900 disposed below the first substrate 100. The first semiconductor chip 300 and the heat dissipation plate 800 may be disposed in the first substrate 100, and a second semiconductor chip 1000 in contact with the lower surface of the heat dissipation plate 800 may be disposed in the second substrate 900. That is, the semiconductor package in accordance with this embodiment may be a vertically stacked package.

The first substrate 100 and the second substrate 900 may be electrically connected to each other through substrate pads 140 and 910. Accordingly, the first semiconductor chip 300 and the second semiconductor chip 1000 may be electrically connected to each other. Meanwhile, although the first substrate 100 and the second substrate 900 are directly connected to each other in FIG. 11, if necessary, a conductive structure including the bump balls 400 or the like may be additionally formed between the first substrate 100 and the second substrate 900.

If the first semiconductor chip 300 is, e.g., an image sensor chip, the second semiconductor chip 1000 may be an operation chip. Specifically, if the first semiconductor chip 300 is, e.g., an image sensor chip which converts an external image into an electrical signal, the second semiconductor chip 1000 may be an operation chip which is provided with the electrical signal from the image sensor chip and performs a necessary operation using the electrical signal.

Generally, the operation chip may generate a lot of heat in an operating process. Accordingly, a semiconductor package mounted with the operation chip is required to have good heat dissipation characteristics. In the semiconductor package in accordance with this embodiment, the operation chip is disposed in direct contact with the heat dissipation plate 800. Thus, it is possible to easily solve a heat dissipation problem occurring in the operating process of the operation chip.

Thus, in case of a package in which the first semiconductor chip 300 that is an image sensor chip and the second semiconductor chip 1000 that is an operation chip are vertically stacked, the size of the package can be largely reduced while solving the heat dissipation problem. Therefore, there is an advantage of realizing the miniaturization of final products on which the first and second semiconductor chips 300 and 1000 are mounted.

Figure 12:
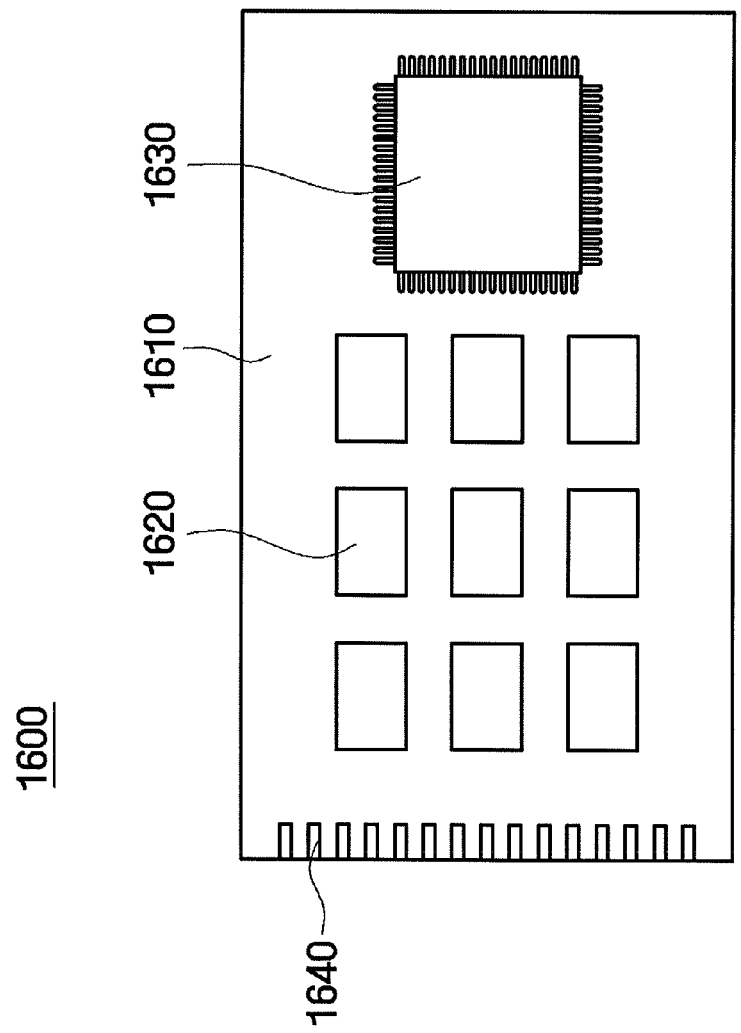

Next, application examples of semiconductor packages in accordance with some embodiments of will be described with reference to FIGS. 12 and 13. FIGS. 12 and 13 illustrate application examples of semiconductor packages in accordance with some embodiments.

Referring to FIG. 12, the above-described semiconductor packages may be applied to a package module 1600 including various kinds of semiconductor devices. The package module 1600 may include a circuit board 1610 provided with a terminal 1640, a semiconductor chip 1620 mounted on the circuit board 1610, and a semiconductor chip 1630 packaged in a quad flat package (QFP). The semiconductor packages in accordance with the embodiments may be applied to the semiconductor chips 1620 and 1630. The package module 1600 may be connected to an external electronic device through the terminal 1640.

Referring to FIG. 13, the above-described semiconductor packages may be applied to the electronic system 1700. The electronic system 1700 may include a controller 1710, an input/output device 1720, and a memory device 1730. The controller 1710, the input/output device 1720, and the memory device 1730 may be coupled to each other via a bus 1750 providing a data transmission path.

For example, the controller 1710 may include at least one microprocessor, digital signal processor, microcontroller, and at least one of logic devices capable of performing functions similar to those thereof The input/output device 1720 may include at least one selected from a keypad, a keyboard, a display device and the like. Particularly, if the electronic system 1700 is a system associated with image processing, an image input from the outside may be transmitted to the controller 1710 through the input/output device 1720.

The memory device 1730 may store data and/or commands to be executed by the controller 1710. The memory device 1730 may include a volatile memory device such as DRAM and/or a non-volatile memory device such as a flash memory. For example, the flash memory may be mounted on an information processing system such as a mobile device or a desktop computer. The flash memory may be configured as a semiconductor disk device (SSD). In this case, the electronic system 1300 may stably store large-capacity data in the flash memory system.

At least one of the controller 1710, the input/output device 1720 and the memory device 1730 may include the above-described semiconductor package.

The electronic system 1700 may further include an interface 1740 to transmit/receive data to/from a communication network. The interface 1740 may be a wired or wireless interface. For example, the interface 1740 may include an antenna or a wired/wireless transceiver or the like. The electronic system 1700 may further include an application chipset, a camera image processor (CIS), an input/output device and the like.

The electronic system 1700 may be implemented by a mobile system, a personal computer, an industrial computer, or a logic system performing various functions or the like. For example, the mobile system may be a personal digital assistant (PDA), portable computer, web tablet, mobile phone, wireless phone, laptop computer, memory card, digital music system, or information transmitting/receiving system. If the electronic system 1300 is equipment capable of performing wireless communication, the electronic system 1300 may be used in communication systems such as code division multiple access (CDMA), global system for mobile communication (GSM), North American digital cellular (NADC), enhanced-time division multiple access (E-TDMA), wideband code division multiple access (WCDAM) and CDMA2000.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a light transmissive cover having a conductive pattern;
a substrate having a cavity;
a semiconductor chip in the cavity of the substrate and electrically connected to the conductive pattern on the light transmissive cover;
a blocking pattern between the light transmissive cover and the substrate; and
an underfill material between the light transmissive cover and the substrate, the blocking pattern separating the underfill material from the semiconductor chip.

2. The semiconductor package as claimed in claim 1, wherein the underfill material includes at least one of epoxy resin and silicone resin.

3. The semiconductor package as claimed in claim 1, wherein the blocking pattern is in contact with the substrate and separated from the light transmissive cover.

4. The semiconductor package as claimed in claim 1, wherein the blocking pattern is in contact with the conductive pattern of the light transmissive cover and separated from the substrate.

5. The semiconductor package as claimed in claim 1, wherein the blocking pattern includes a first blocking pattern in contact with the substrate and a second blocking pattern in contact with the light transmissive cover.

6. The semiconductor package as claimed in claim 5, wherein the first blocking pattern and the second blocking pattern include different materials.

7. The semiconductor package as claimed in claim 5, wherein the first blocking pattern and the second blocking pattern are separated from each other.

8. The semiconductor package as claimed in claim 1, wherein the conductive pattern on the light transmissive cover is electrically connected to the semiconductor chip using bump balls.

9. The semiconductor package as claimed in claim 1, wherein the semiconductor chip includes an image sensor chip.

10. The semiconductor package as claimed in claim 1, further comprising:
a through hole extending from the cavity, the semiconductor chip covering the through hole; and
a heat dissipation plate in the through hole of the substrate and disposed below the semiconductor chip.

11. The semiconductor package as claimed in claim 10, wherein a lower surface of the heat dissipation plate and a lower surface of the substrate are on a same plane.

12. The semiconductor package as claimed in claim 10, further comprising a second semiconductor chip electrically connected to the first semiconductor chip and in contact with a lower surface of the heat dissipation plate.

13. The semiconductor package as claimed in claim 12, wherein the first semiconductor chip includes an image sensor chip, and the second semiconductor chip includes an operation chip.

14. The semiconductor package as claimed in claim 10, wherein the through hole has a first diameter and the cavity has a second diameter larger than the first diameter.

15. A semiconductor package, comprising:
a light transmissive cover having a conductive pattern;
a substrate having a cavity;
a semiconductor chip in the cavity of the substrate and electrically connected to the conductive pattern on the light transmissive cover;
a blocking pattern between the light transmissive cover and the substrate, the blocking pattern configured to prevent material provided between the light transmissive cover and the substrate from reaching the semiconductor chip; and
an underfill material between the light transmissive cover and the substrate, the blocking pattern separating the underfill material from the semiconductor chip.

16. The semiconductor package as claimed in claim 15, wherein the blocking pattern is in contact with the substrate.

17. The semiconductor package as claimed in claim 16, wherein the blocking pattern is separated from the light transmissive cover.

18. The semiconductor package as claimed in claim 15, wherein the blocking pattern is in contact with the conductive pattern.

19. The semiconductor package as claimed in claim 18, wherein the blocking pattern is separated from the substrate.

* * * * *